(12) United States Patent
Fogg

(10) Patent No.: US 7,625,223 B1
(45) Date of Patent: Dec. 1, 2009

(54) CONNECTOR SYSTEM WITH FLOATING HEAT SINK

(75) Inventor: Michael Warren Fogg, Harrisburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/243,773

(22) Filed: Oct. 1, 2008

(51) Int. Cl.
*H01R 13/648* (2006.01)

(52) U.S. Cl. ............... 439/92; 439/607.3; 439/487; 361/715; 361/719

(58) Field of Classification Search ............ 439/92, 439/487, 607.3, 95, 607.28; 361/715, 719, 361/704, 707, 720; 165/80.2, 185, 80.3; 257/718, 719
See application file for complete search history.

(56) References Cited

U.S. PATENT DOCUMENTS

| | | | |
|---|---|---|---|
| 4,716,494 A | 12/1987 | Bright et al. | |
| 5,241,453 A | 8/1993 | Bright et al. | |
| 5,357,404 A | 10/1994 | Bright et al. | |
| 5,448,449 A | 9/1995 | Bright et al. | |
| 5,833,472 A | 11/1998 | Bright et al. | |
| 6,116,924 A * | 9/2000 | Laut | 439/95 |
| 6,624,432 B1 | 9/2003 | Gabower et al. | |
| 6,780,030 B2 * | 8/2004 | Yoshinaga et al. | 439/92 |
| 6,816,376 B2 | 11/2004 | Bright et al. | |
| 6,930,884 B2 * | 8/2005 | Cromwell et al. | 361/710 |
| 6,980,437 B2 | 12/2005 | Bright et al. | |
| 7,355,857 B2 * | 4/2008 | Pirillis et al. | 361/715 |
| 7,382,620 B2 * | 6/2008 | Khanna et al. | 361/719 |
| 2002/0070448 A1 * | 6/2002 | Gonzalez et al. | 257/727 |

* cited by examiner

*Primary Examiner*—Gary F. Paumen

(57) ABSTRACT

A receptacle assembly includes a guide frame, a heat sink and a conductive gasket. The guide frame includes a top wall and defines an interior chamber that is configured to receive a mating connector. The top wall defines an opening that provides access to the interior chamber. The heat sink is held in the interior chamber such that at least an upper portion of the heat sink produces through the opening and a lower portion of the heat sink engages the mating connector when the mating connector is loaded in the interior chamber. The conductive gasket is held in the interior chamber between the guide frame and the heat sink. The gasket is configured to be compressed between the guide frame and the heat sink when the mating connector is loaded into the interior chamber such that the gasket provides a conductive path between the heat sink and the guide frame.

20 Claims, 3 Drawing Sheets

CONNECTOR SYSTEM WITH FLOATING HEAT SINK

BACKGROUND OF THE INVENTION

The subject matter herein generally relates to connector systems and, more particularly, to connector systems that include a receptacle assembly with a heat sink.

Various types of connector systems include a mating assembly and a receptacle connector. The mating assembly is inserted into the receptacle connector to electrically connect the mating assembly and the receptacle connector. Some known receptacle connectors include connector cages that are electrically connected to an electrical ground. These connector cages are electrically connected to the electrical ground to shield the mating assembly from electromagnetic interference.

Some known receptacle connectors include heat sinks that engage the mating assembly when the mating assembly is loaded into the receptacle connector. The heat sinks establish a thermal contact with the mating assembly in order to dissipate at least some of the heat generated by the mating assembly. The thermal contact between the heat sinks and the mating assembly is established in known receptacle connectors through a hole in the respective connectors. For example, some connector cages include holes in a top side of the connector cage. The heat sink rests above the connector cage such that a portion of the heat sink partially extends into the connector cage. The portion of the heat sink that extends into the connector cage engages the mating assembly to establish the thermal contact between the heat sink and the mating assembly.

Yet, these holes in the receptacle connectors provide a seam or gap for electromagnetic interference to escape. For example, known receptacle connectors include seams between the heat sink and the connector cage of the receptacle connector in locations proximate to the hole in the connector cage. Electromagnetic interference escapes through these seams into the surrounding environment. This electromagnetic interference can interfere with adjacent connectors and connector systems, which is undesirable and may violate government regulations. For example regulations such as 47 C.F.R. §15 may be violated if too much electromagnetic interference is permitted to escape from the receptacle connectors.

Thus, a need exists for connector systems having receptacle connectors that provide thermal contact between a heat sink and a mating assembly. The connector system may provide the thermal contact while reducing the amount of electromagnetic interference that escapes from the receptacle connector. For example, the connector system may reduce the amount of electromagnetic interference that escapes through an interface between the heat sink and the receptacle assembly.

BRIEF DESCRIPTION OF THE INVENTION

In one embodiment, a receptacle assembly is configured to receive a mating connector. The receptacle assembly includes a guide frame, a heat sink and a conductive gasket. The guide frame includes a top wall and defines an interior chamber that is configured to receive the mating connector. The top wall defines an opening that provides access to the interior chamber. The heat sink is held in the interior chamber such that at least an upper portion of the heat sink protrudes through the opening and a lower portion of the heat sink engages the mating connector when the mating connector is loaded in the interior chamber. The conductive gasket is held in the interior chamber between the guide frame and the heat sink. The gasket is configured to be compressed between the guide frame and the heat sink when the mating connector is loaded into the interior chamber such that the gasket provides a conductive path between the heat sink and the guide frame.

In another embodiment, another receptacle assembly includes a guide frame, an upper conductive gasket and a heat sink. The guide frame includes a top wall, a rear wall and opposing side walls that partially surround an interior chamber. The interior chamber is configured to receive a mating connector. The upper conductive gasket is disposed beneath the top wall. The heat sink is held in the interior chamber and positioned such that the upper gasket is held between the guide frame and the heat sink. The upper conductive gasket is configured between the heat sink and the top wall when the mating connector is loaded into the interior chamber to provide a conductive pathway between the heat sink and the guide frame.

In another embodiment, another receptacle assembly is configured to be mounted to a circuit board. The receptacle assembly includes a guide frame and a lower conductive gasket. The guide frame includes a top wall, a rear wall and opposing side walls. The rear wall and side walls extend between the top wall and a mounting end. The mounting ends of the rear and side walls define a perimeter on the circuit board. The lower conductive gasket is proximate to the mounting end of at least one of the side walls and rear wall. The lower gasket is disposed between the circuit board and at least one of the side walls and the rear wall. The lower conductive gasket electrically connects the guide frame to an electrical ground of the circuit board to seal electromagnetic interference around at least a portion of the perimeter.

DETAILED DESCRIPTION OF THE INVENTION

Figure 1:
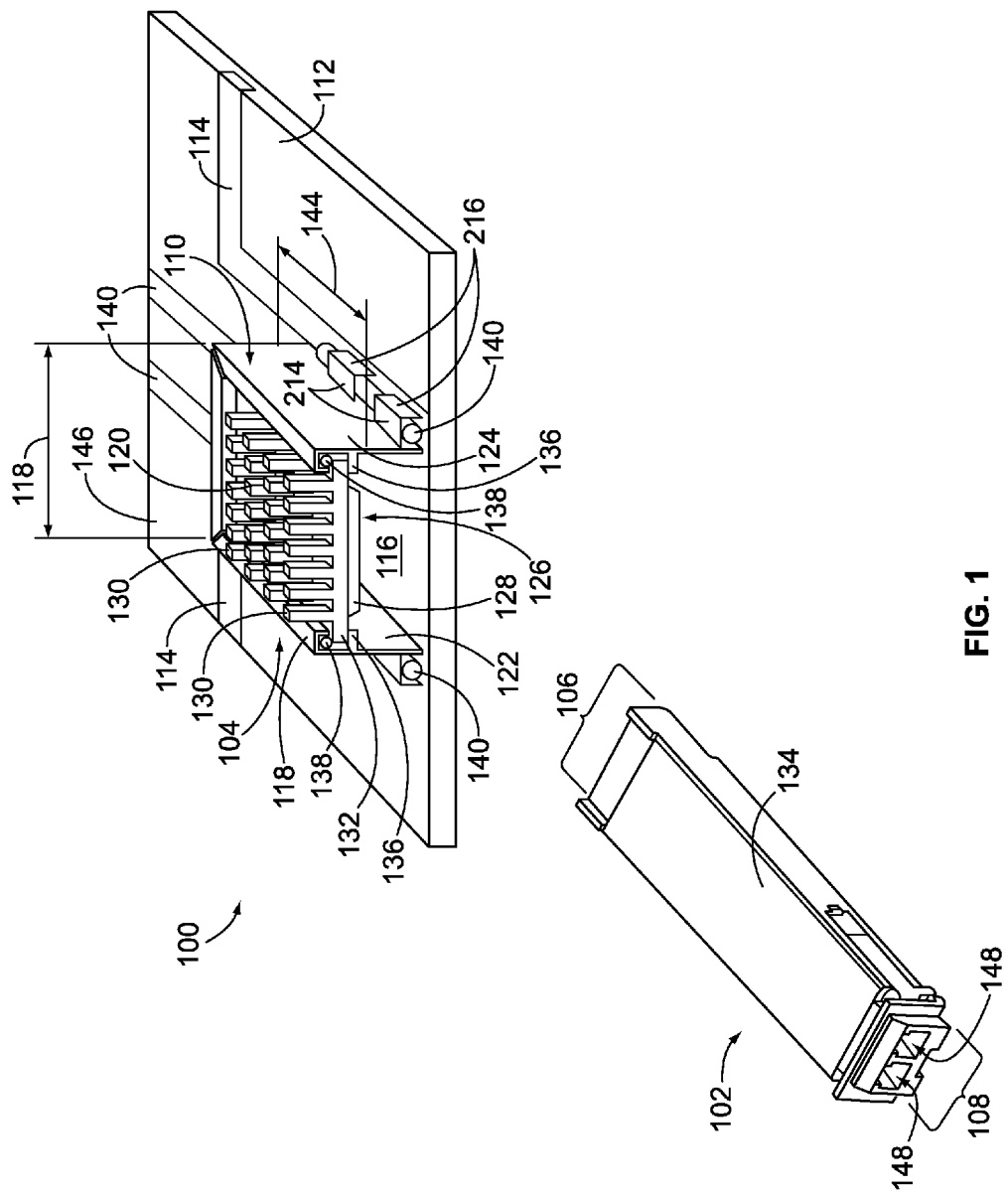
FIG. 1 is a perspective view of a connector system according to one embodiment.

FIG. 1 is a perspective view of a connector system 100 according to one embodiment. The connector system 100 includes a mating connector 102 and a receptacle assembly 104. The mating connector 102 includes a body 134 that extends between a mating end 106 and a cable end 108. The cable end 108 has a cable jacks 148 that receive one or more cable plugs (not shown). The mating end 106 is loaded into the receptacle assembly 104 to electrically connect the mating connector 102 and the receptacle assembly 104. The cable plugs (not shown) received in the mating connector 102 through the cable end 108 may communicate at least one of a data and power signal with the receptacle assembly 104 when the mating connector 102 and the receptacle assembly 104 are mated and electrically connected.

The receptacle assembly 104 includes a guide frame 110 that is mounted to a circuit board 112. In the illustrated embodiment, the guide frame 110 is mounted to a portion of the circuit board 112. The receptacle assembly 104 and the guide frame 110 are electrically connected to at least one conductive trace 114 in the circuit board 112. For example, the guide frame 110 may be electrically connected to an electrical ground of the circuit board 112 by the conductive traces 114. The guide frame 110 includes or represents a connector cage for the receptacle assembly 104 in one embodiment. For example, the guide frame 110 receives the mating connector 102 and shields the connector assembly (not shown) in the receptacle assembly 104 from electromagnetic interference in one embodiment.

The guide frame 110 defines an interior chamber 116. A connector assembly (not shown) is housed in the interior chamber 116 and is shaped to mate with the mating end 106 of the mating connector 102. The connector assembly is electrically connected to the circuit board 112. For example, the connector assembly may be electrically connected to one or more conductive traces 142 in the circuit board 112. The interior chamber 116 receives the mating connector 102 when the mating connector 102 is loaded into the receptacle assembly 104. The mating connector 102 is electrically connected to a circuit board 112 and the conductive traces 142 when the mating connector 102 is loaded into the interior chamber 116 and mated with the connector assembly in the interior chamber 116.

The guide frame 110 includes a top wall 118, a rear wall 120 and opposing side walls 122, 124 that partially surround the interior chamber 116. The top wall 118 is substantially perpendicular to the rear and side walls 120, 122, 124. The rear wall 120 is substantially perpendicular to the side walls 122, 124. The side walls 122, 124 are substantially parallel to one another. In the illustrated embodiment, the rear and side walls 120, 122, 124 include a guide frame ledge 136 that extends from the rear and side walls 120, 122, 124 into the interior chamber 116. Alternatively, the guide frame ledge 136 may extend from less than all of the rear and side walls 120, 122, 124.

In one embodiment, one or more of the rear and side walls 120, 122, 124 includes one or more laterally projecting members 214 and one or more lower downwardly projecting members 216. The laterally projecting members 214 include extensions of the rear side walls 120, 122, 124 that extend away from the rear and side walls 120, 122, 124 and are substantially parallel to the circuit board 112. The lower downwardly projecting members 216 include extensions of the rear and side walls 120, 122, 124 that extend downward from the laterally projecting members 214 in a direction that is substantially perpendicular to the circuit board 112. Each of the laterally projecting members 214 may extend along a portion of a length 144, 146 of the side or rear walls 122, 124, 120, as shown in the illustrated embodiment. Alternatively, the laterally projecting members 214 may extend along the entirety of the length 144, 146 of the side or rear walls 122, 124, 120.

The guide frame 110 may include, or be formed from, a conductive material. For example, the guide frame 110 can include a metal material. In one embodiment, the guide frame 110 is a continuous piece that is homogeneously formed of a single or common material. For example, the guide frame 110 may be stamped and formed from a common sheet of conductive material. In another embodiment, the guide frame 110 is formed from a die cast metal. Forming the guide frame 110 as a continuous piece of material can reduce or eliminate seams or gaps at interfaces between two or more of the top, rear and side walls 118 120, 122, 124. Reducing or eliminating seams or gaps in the guide frame 110 may reduce or eliminate the amount of electromagnetic interference that leaks or escapes from the interior chamber 116 of the guide frame 110.

The receptacle assembly 104 includes a heat sink 126 held within the interior chamber 116 below the top wall 118. The heat sink 126 includes an engagement portion 128 on the bottom of the heat sink 126. The engagement portion 128 engages the mating connector 102 when the mating connector 102 is loaded into the interior chamber 116. The engagement between the mating connector 102 and the engagement portion 128 provides a thermally conductive pathway between the mating connector 102 and the heat sink 126. The heat sink 126 includes a plurality of heat dissipation elements 130 extending from a side of the heat sink 126 that is opposite the engagement portion 128. As shown in FIG. 1, the heat dissipation elements 130 protrude from the interior chamber 116 and from the guide frame 110 through a heat sink opening 220 (shown in FIG. 2) in the guide frame 110. The heat dissipation elements 130 are interconnected with the engagement portion 128 such that heat from the mating connector 102 passes from the engagement portion 128 to the heat dissipation elements 130. The heat dissipation elements 130 include sufficient surface area to permit the dissipation of at least some of the heat generated by the mating connector 102 into the surrounding atmosphere. The heat dissipation elements 130 are interconnected with the engagement portion 128 by a heat sink ledge 132. The heat sink ledge 132 may be supported by the guide frame ledge 136. For example, the guide frame ledge 136 supports the heat sink ledge 132 and the heat sink 126 above the circuit board 112 when the mating connector 102 is not loaded into the interior chamber 116. In one embodiment, the heat sink 126 includes, or is formed from, a conductive material. For example, the heat sink 126 may be formed from a metal material.

The receptacle assembly 104 includes an upper gasket 138 held beneath the top wall 118 between the heat sink 126 and the guide frame 110. As shown in the illustrated embodiment, the upper gasket 138 may be held between the heat sink ledge 132 and the top wall 118. The upper gasket 138 includes, or is formed from, a conductive material. For example, the upper gasket 138 may be formed from a thermally and electrically conductive elastomeric material. As described below, the upper gasket 138 is compressed between the heat sink 126 and the top wall 118 to provide at least one of a thermally and electrically conductive pathway between the heat sink 126 and the guide frame 110.

In the illustrated embodiment, the receptacle assembly 104 includes a lower gasket 140 held between the guide frame 110 and the circuit board 112. As shown in the illustrated embodiment, the lower gasket 140 may be held between the rear and side walls 120, 122, 124 and the conductive trace 114 in the circuit board 112. The lower gasket 140 includes, or is formed from, a conductive material. For example, the lower gasket 140 may be formed from a thermally and electrically conductive elastomeric material. As described below, the lower gasket 140 provides an electrically conductive pathway between the guide frame 110 and the circuit board 112.

Figure 2:
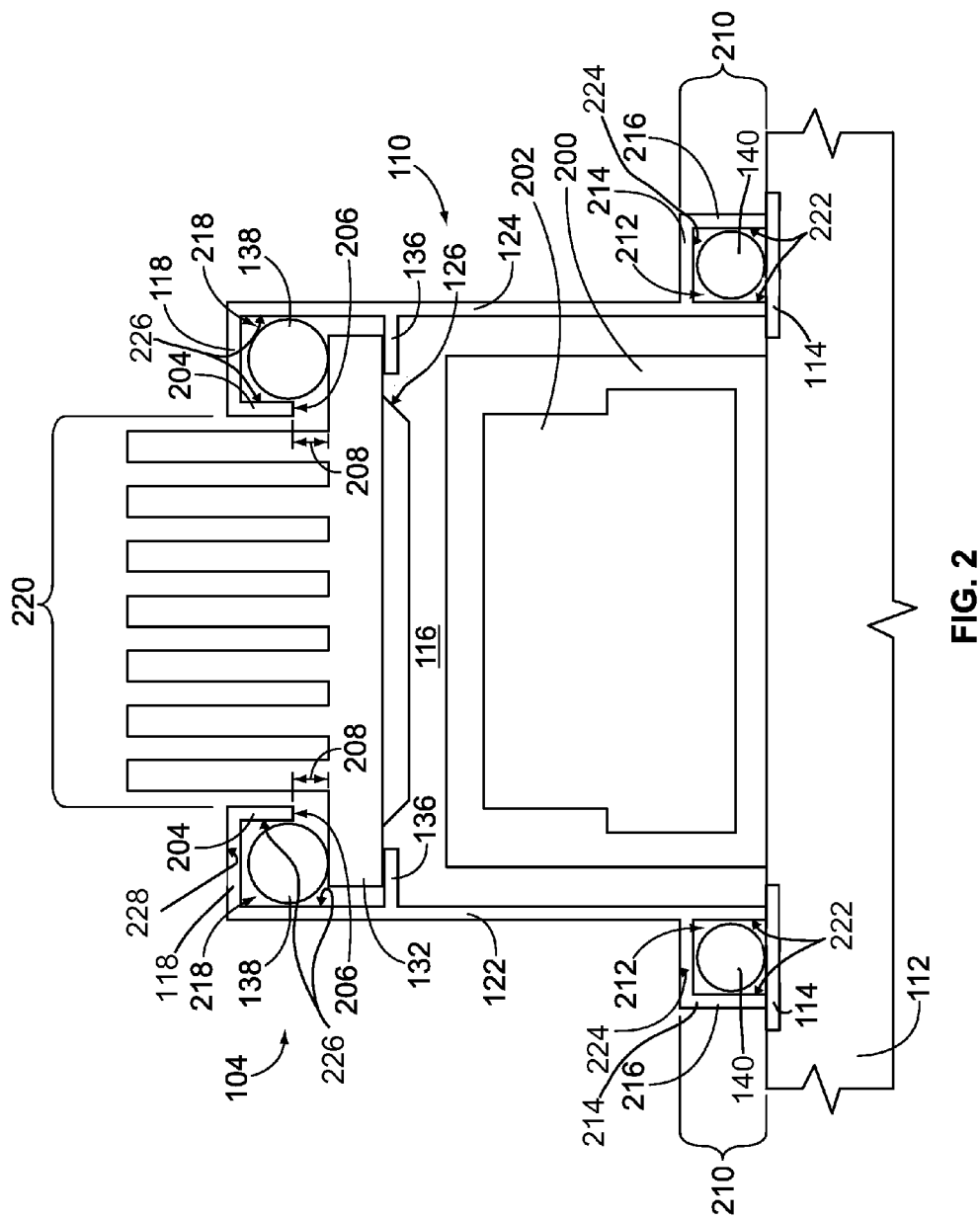
FIG. 2 is a schematic elevational view of a receptacle assembly shown in FIG. 1 with a circuit board shown in FIG. 1, with the circuit board shown in a partial cross sectional view.

FIG. 2 is a schematic elevational view of the receptacle assembly 104 with the circuit board 112 shown in a partial cross sectional view. As shown in FIG. 2, the connector assembly 200 is held in the interior chamber 116. The connector assembly 200 includes an interface 202 that is configured to receive and mate with the mating end 106 (shown in FIG. 1) of the mating connector 102 (shown in FIG. 1). The connector assembly 200 is illustrated schematically in FIG. 1 but may include any shape or orientation configured to mate with the mating connector 102.

The heat sink opening 200 provides access to the interior chamber 116 from outside of the receptacle assembly 104. At least a portion of the heat sink 126 protrudes through the heat sink opening 220 in the guide frame 110. For example, the top wall 118 may partially surround and define the heat sink opening 220 in the guide frame 110. The heat sink opening 220 provides access to, and communication with, the interior chamber 116. For example, the heat dissipation elements 130 may partially protrude through the heat sink opening 220 while the remainder of the heat sink opening 220 is held in the interior chamber 116.

The rear wall 120 (shown in FIG. 1) and the side walls 122, 124 are mounted to the circuit board 112 in a location that is proximate to a mounting end 210 of each of the rear and side walls 120, 122, 124. The mounting ends 210 of the rear and side walls 120, 122, 124 define a perimeter the circuit board 112 that opposes the top wall 118 and partially encloses the interior chamber 116. The mounting ends 210 of the rear end side walls 120, 122, 124 may include pins (not shown) or other members configured to mount and secure the rear and side walls 120, 122, 124 to the circuit board 112. The mounting end 120 of one or more of the rear and side walls 120, 122, 124 defines a lower channel 212. For example, the mounting ends 210 may include the laterally projecting members 214 and lower downwardly projecting members 216. The laterally projecting members 214, lower downwardly projecting members 216, and the rear and side walls 120, 122, 124 define the lower channel 212 in one embodiment. The lower channel 212 may hold the lower gasket 140.

The lower gasket 140 extends around at least a portion of the perimeter of the circuit board 112 that is defined by the mounting ends 210 of the side and rear walls 118, 120, 122. In one embodiment, the lower gasket 140 is a single, continuous, homogeneously formed tubular member formed of an elastomeric and conductive material. In another embodiment, the lower gasket 140 may be replaced with one or more conductive springs that are at least partially compressed between the laterally projecting members 214 and the conductive traces 114. In one embodiment, the lower gasket 140 is at least partially compressed in the lower channel 212 between the conductive traces 114 and one or more of the laterally projecting members 214, the lower downwardly projecting members 216 and the rear side walls 120, 122, 124. When compressed, the lower gasket 140 changes shape to at least partially mold to, or otherwise take the shape of, the surfaces compressing the lower gasket 140. For example, inner surfaces 222, 224 of the lower channel 212 may contact the lower gasket 140 and compress the lower gasket 140 against the circuit board 112. The lower gasket 140 electrically connects the guide frame 110 with the conductive traces 114. For example, the lower gasket 140 may be compressed within the lower channel 212 such that the lower gasket 140 electrically connects the guide frame 110 to the electrical ground of the circuit board 112. In one embodiment, the lower gasket 140 provides an electromagnetic seal around at least a portion of the interface between the circuit board 112 and the rear side walls 120, 122, 124. For example, the lower gasket 140 can fill in and reduce the size and/or presence of gaps and seams between the conductive traces 114 and any of the rear and side walls 120, 122, 124. By reducing the size and/or pressure of gaps and seams between the interfaces between the conductive traces 114 and one or more of the rear and side walls 120, 122, 124, the lower gasket 140 may reduce the amount of electromagnetic interference that leaks or escapes from the interior chamber 116.

The top wall 118 includes a downwardly projecting member 204 that extends from the top wall 118 toward the circuit board 112. The downwardly projecting member 204 extends from the top wall 118 to an end 206. The downwardly projecting member 204 may extend along the lengths 144, 146 of the side walls 122, 124 and the rear wall 120 in one embodiment. Alternatively, the downwardly projecting member 204 may extend along a portion, but less than all, of the lengths 144, 146 of the side walls 122, 124 and the rear wall 120. The top wall 118, downwardly projecting member 204, guide frame ledge 136 and a portion of the side walls 122, 124 define upper channels 218. The upper gasket 138 is held in the upper channels 218.

The end 206 of the downwardly projecting member 204 acts as a mechanical stop to a vertical travel of the heat sink 126 in one embodiment. For example, the receptacle assembly 104 is shown in FIG. 2 with the mating connector 102 removed from the interior chamber 116. The heat sink 126 is positioned between the guide frame ledge 136 and the end 206 of the downwardly projecting member 204. The heat sink ledge 132 is separated from the end 206 by a vertical travel distance 208. The vertical travel distance 208 is the maximum distance that the heat sink 126 may be displaced towards the top wall 118 before engaging the end 206. In one embodiment, when the mating connector 102 (shown in FIG. 1) is not loaded into the interior chamber 116, the heat sink 126 is supported above the circuit board 112 by the guide frame ledge 136. The heat sink 126 is vertically displaced, or raised, towards the top wall 118 and the end 206 of the downwardly projecting member 204 when the mating connector 102 is loaded into the interior chamber 116. For example, the heat sink 126 may float between the guide frame ledge 136 and the ends 206.

Figure 3:
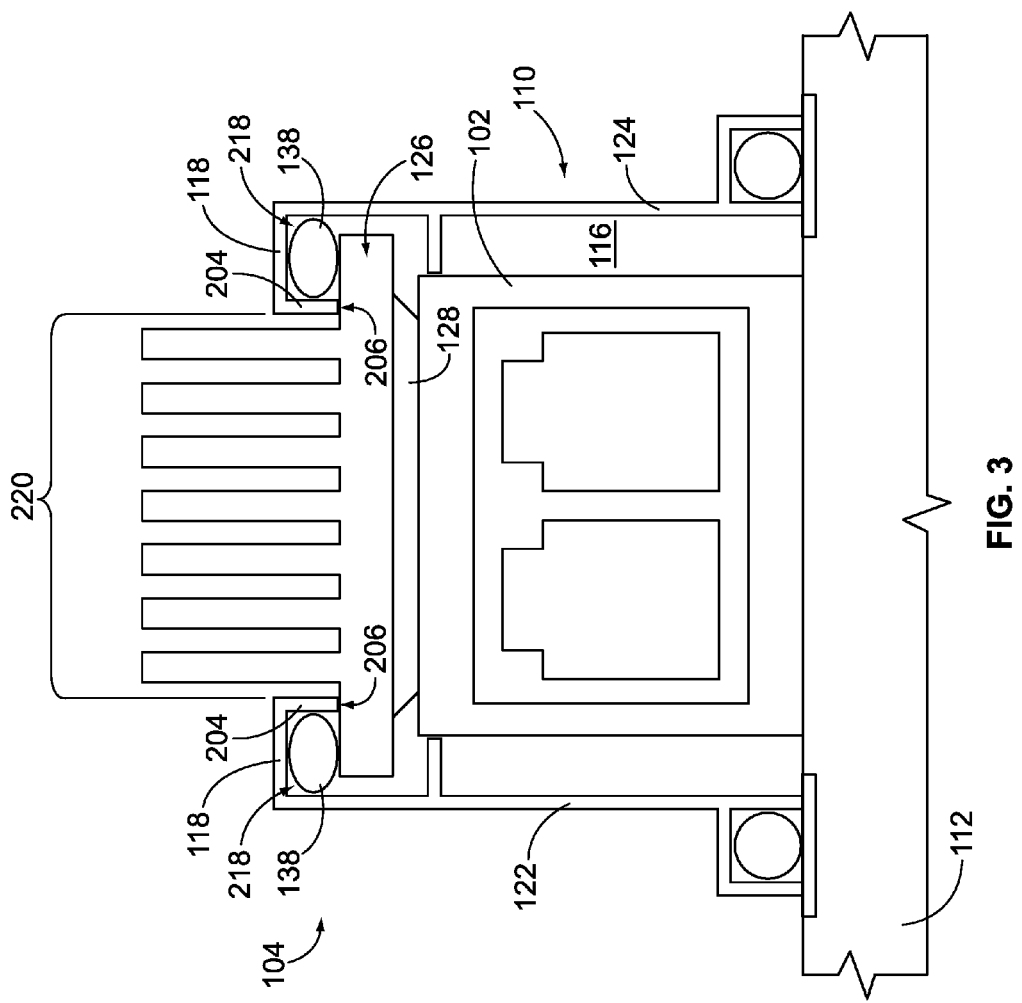
FIG. 3 is a schematic elevational view of the receptacle assembly shown in FIG. 1 with a mating connector shown in FIG. 1 loaded in an interior chamber shown in FIG. 1.

FIG. 3 is a schematic elevational view of the receptacle assembly 104 with the mating connector 102 loaded in the interior chamber 116 (shown in FIG. 1). As shown in FIG. 3, the mating connector 102 engages the heat sink 126 and raises the heat sink 126 away from the circuit board 112 and toward the top wall 118 of the guide frame 110. For example, the mating connector 102 may engage the engagement portion 128 of the heat sink 126 and vertically displace the heat sink 126 towards the top wall 118. The total distance that the heat sink 126 is raised is limited by the end 206 of the downwardly projecting member 204. For example, the end 206 may prevent the heat sink 126 from be raised by the mating connector 102 by more than the vertical travel distance 208 (shown in FIG. 2).

The upper gasket 138 is compressed in the upper channel 218 as the heat sink 126 is raised by the mating connector 102. For example, the vertical displacement of the heat sink 126 may compress the upper gasket 138 between the heat sink 126 and inner surfaces 226, 228 of the upper channel 218. In one embodiment, the upper gasket 138 is an elastomeric and conductive material. For example, the upper gasket 138 may be a single, continuous, homogeneously formed tubular member formed of a conductive and elastomeric material that at least partially extends around the periphery of the heat sink opening 220. The upper gasket 138 may at least partially flatten, elongate or otherwise change shape to conform to the inner surfaces 226, 228 of the upper channel 218. In another embodiment, the upper gasket 138 may be replaced with one or more conductive springs that are at least partially compressed in the upper channel 218. The upper gasket 138 engages the heat sink 126 and the guide frame 110 to provide a thermally conductive path between the heat sink 126 and the guide frame 110. For example, the upper gasket 138 may be compressed between the heat sink 126 and the guide frame 110 to provide a thermal contact between the heat sink 126 and the guide frame 110 that extends around substantially all of the periphery of the heat sink opening 220 in locations where the upper gasket 138 is present. The upper gasket 13 may then provide an improved thermally conductive pathway between the guide frame 110 and the heat sink 126 such that the amount of heat from the guide frame 110 that is dissipated through the heat sink 126 is improved. In one embodiment, the upper gasket 138 engages the heat sink 126 and the guide frame 110 to provide an electrically conductive path between the heat sink 126 and the guide frame 110. For example, in one embodiment where the heat sink 126, the guide frame 110 and the upper gasket 138 comprises conductive materials and the guide frame 110 is electrically connected to the electrical ground of the circuit board 112, the upper gasket 138 may be compressed between the heat sink 126 and the guide frame 110 to provide an electromagnetic seal between the heat sink 126 and the guide frame 110 that extends around substantially all of the periphery of the heat sink opening 220 in locations where the upper gasket 138 is present. The upper gasket 138 may then reduce the amount of electromagnetic interference that leaks or escapes from the interior chamber 116 through the interface between the heat sink 126 and the guide frame 110.

As described above, the ends 206 of the downwardly projecting members 204 may be positioned to limit the amount of vertical displacement of the heat sink 126 in the interior chamber 116. The location of the ends 206 may limit the amount of compression of the upper gasket 138. For example, if the ends 206 are located to permit a greater amount of vertical displacement of the heat sink 126 than is shown in FIGS. 2 and 3, then the upper gasket 138 may be compressed a greater amount in the upper channel 218. Alternatively, if the ends 206 are located to permit a lesser amount of vertical displacement of the heat sink 126 than is shown in FIGS. 2 and 3, then the upper gasket 138 may be compressed a lesser amount in the upper channel 218.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and merely are example embodiments.

Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not within in means—plus-function format and are not intended to be interpreted based on 35 U.S.C. §112, sixth paragraph, unless and until such claim limitations expressly use the phrase "means for" followed by a statement of function void of further structure.

What is claimed is:

1. A receptacle assembly configured to receive a mating connector, the receptacle assembly comprising:

a guide frame comprising a top wall and defining an interior chamber configured to receive the mating connector, the top wall defining an opening that provides access to the interior chamber;

a heat sink held in the interior chamber such that at least an upper portion of the heat sink protrudes through the opening and a lower portion of the heat sink engages the mating connector when the mating connector is loaded in the interior chamber; and a conductive gasket held in the interior chamber between the guide frame and the heat sink, the gasket configured to be compressed between the guide frame and the heat sink when the mating connector is loaded into the interior chamber such that the gasket provides a conductive path between the heat sink and the guide frame.

2. The receptacle assembly of claim 1, wherein the gasket forms a grounding seal between the heat sink and the guide frame when the mating connector is loaded into the interior chamber to prevent electromagnetic interference from escaping from the interior chamber between the heat sink and the guide frame.

3. The receptacle assembly of claim 1, wherein the gasket at least partially changes shape to conform to one or more inner surfaces of the guide frame that compress the gasket.

4. The receptacle assembly of claim 1, wherein the heat sink is held beneath the top wall and the gasket is held between the top wall and the heat sink.

5. The receptacle assembly of claim 1, wherein the guide frame comprises opposing side walls connected to the top wall and a ledge extending into the interior chamber, the heat sink floating between the ledge and the top wall such that the heat sink is supported by the ledge when the mating connector is removed from the interior chamber and the heat sink is vertically displaced away from the ledge to compress the gasket when the mating connector is loaded into the interior chamber.

6. The receptacle assembly of claim 1, wherein the top wall comprises a downwardly projecting member that forms an upper channel, the gasket being held in the upper channel.

7. The receptacle assembly of claim 1, wherein the top wall comprises a downwardly projecting member that limits a displacement of the heat sink with respect to the interior chamber when the mating connector is loaded into the interior chamber.

8. The receptacle assembly of claim 1, further comprising a lower conductive gasket, wherein the guide frame comprises a plurality of opposing side walls connected to the top wall, the side walls comprising a mounting end that is configured to be mounted to a circuit board, the mounting end comprising a lower channel configured to receive the lower conductive gasket to electrically connect the guide frame to an electrical ground of the circuit board.

9. A receptacle assembly comprising:

a guide frame comprising a top wall, a rear wall and opposing side walls that partially surround an interior chamber, the interior chamber configured to receive a mating connector;

an upper conductive gasket disposed beneath the top wall; and a heat sink held in the interior chamber and positioned such that the upper gasket is held between the guide frame and the heat sink, wherein the upper conductive gasket is compressed between the heat sink and the guide frame when the mating connector is loaded into the interior chamber to provide a conductive pathway between the heat sink and the guide frame.

10. The receptacle assembly of claim 9, wherein the top wall comprises a downwardly projecting member, wherein the top wall, the downwardly projecting member and at least a portion of the side walls define an upper channel, the upper conductive gasket being held in the upper channel.

11. The receptacle assembly of claim 9, wherein the top wall comprises a downwardly projecting member, the downwardly projecting member limiting a vertical displacement of the heat sink caused by the mating connector when the mating connector is loaded into the interior chamber.

12. The receptacle assembly of claim 9, wherein at least one of the rear wall and the side walls comprises a ledge extending into the interior chamber, the heat sink supported by the ledge when the mating connector is removed from the interior chamber.

13. The receptacle assembly of claim 9, wherein the top wall comprises a heat sink opening in communication with the interior chamber and at least a portion of the heat sink protrudes through the heat sink opening.

14. The receptacle assembly of claim 9, wherein the receptacle assembly is configured to be mounted to a circuit board, and further comprising a lower conductive gasket disposed between the circuit board and at least one of the side walls and the rear wall, the lower conductive gasket electrically connecting the guide frame to an electrical ground of the circuit board.

15. A receptacle assembly configured to be mounted to a circuit board, the receptacle assembly comprising:
 a guide frame comprising a top wall a rear wall and opposing side walls, the rear wall and side walls extending between the top wall and a mounting end, the mounting ends of the rear and side walls at least partially extending around a perimeter; and
 a lower conductive gasket extending around at least a portion of the perimeter and disposed proximate to the mounting end of at least one of the side walls and rear wall, the lower gasket disposed between the circuit board and the guide frame, the lower conductive gasket electrically connecting the guide frame to an electrical ground of the circuit board to seal electromagnetic interference around the perimeter.

16. The receptacle assembly of claim 15, wherein at least one of the rear wall and the side walls comprises a laterally protruding portion and a downwardly projecting portion, the laterally and downwardly projecting portions defining a lower channel in which at least a portion of the lower conductive gasket is held.

17. The receptacle assembly of claim 15, wherein the top wall, the rear wall and the side walls partially surround an interior chamber that is configured to receive a mating connector, and further comprising an upper conductive gasket and a heat sink, the heat sink being held in the interior chamber beneath the top wall and the upper conductive gasket disposed between the top wall and the heat sink.

18. The receptacle assembly of claim 17, wherein the upper conductive gasket is compressed between the heat sink and the top wall when the mating connector is loaded into the interior chamber to provide a conductive pathway between the heat sink and the guide frame.

19. The receptacle assembly of claim 15, wherein the top wall comprises a downwardly projecting member, the downwardly projecting member limiting at least one of a vertical displacement of the heat sink and an amount of compression of the upper conductive gasket caused by the mating connector when the mating connector is loaded into the interior chamber.

20. The receptacle assembly of claim 15, wherein at least one of the rear wall and the side walls comprises a ledge extending into the interior chamber, the heat sink supported by the ledge when the mating connector is removed from the interior chamber.

* * * * *